United States Patent [19]
Okui

[11] Patent Number: 5,667,073
[45] Date of Patent: Sep. 16, 1997

[54] CARRIER TAPE FOR STORAGE USE OF ELECTRONIC COMPONENTS

[76] Inventor: Tokujiro Okui, C-10-204 3-3, Shin-senri-minami-machi, Toyonaka-shi, Osaka, Japan

[21] Appl. No.: 697,399

[22] Filed: Aug. 23, 1996

Related U.S. Application Data

[63] Continuation of Ser. No. 459,404, Jun. 2, 1995, abandoned.

[30] Foreign Application Priority Data

Jun. 23, 1994 [JP] Japan .................................. 6-164727
Apr. 12, 1995 [JP] Japan .................................. 7-111201

[51] Int. Cl.$^6$ .................................................. B65D 85/90
[52] U.S. Cl. .......................... 206/713; 206/714; 209/577
[58] Field of Search ................................ 206/713–717; 209/577, 586

[56] References Cited

U.S. PATENT DOCUMENTS 3,608,711   9/1971   Wiesler et al. ................. 206/714
4,693,607   9/1987   Conway ......................... 209/586
4,966,281   10/1990  Kawanishi et al. ............. 206/714
5,119,934   6/1992   Karasawa et al. .............. 206/716

*Primary Examiner*—Jimmy G. Foster
*Attorney, Agent, or Firm*—Laurence R. Brown

[57] ABSTRACT

The present invention provides a carrier tape for storage use of super-miniaturized electronic components, by which the reflection of irradiated light which might cause detection errors cab be prevented, the product inspection can be performed easily and quickly, and number of stored pieces and remaining un-used pieces can be easily and quickly counted, when the presence or absence of deformation—which might take place on the lead portion of the electronic components being stored in the carrier tape—is examined by the optical equipment on the lead portion kept on the carrier tape. The surface of said base component can be treated to form a film to prevent the light reflection or to absorb the light, such as by painting with resins or ink which doesn't reflect the light, or by immersion. Alternatively, the color of the base component is selected to be black. Moreover, by providing holes for the piece-counting on the carrier tape at a certain intervals, the number of components in the storage area can be counted by the photo-electric tube through said holes.

8 Claims, 5 Drawing Sheets

CARRIER TAPE FOR STORAGE USE OF ELECTRONIC COMPONENTS

This application is a continuation of application Ser. No. 08/459,404, filed Jun. 2, 1995, now abandoned.

BACKGROUND OF THE INVENTION

1. Field of the Invention

The present invention relates generally to a carrier tape with which super-miniaturized electronic components are packed in a manner of a tape-wrapping; said electronic components used for various electronic equipments such as a computer include chip condenser, ceramic condenser, diode, transistor, resistor or the like. The present invention, more particularly, relates to a carrier tape with which it is possible to prevent the reflection of an irradiation light which might cause errors in inspection when the lead wire portion of the electronic components being stored in the carrier tape is inspected with an aid of an optical equipment while keeping said lead wire portion to be adhered to the carrier tape, and it is also possible to conduct the counting the number of pieces of components stored in the storage area in the carrier tape in easier and simpler manners by using a photoelectric tube or the like.

2. Description of the Prior Arts

Super-miniaturized electronic components—which are used for electronic equipment such as computers and include chip condenser, ceramic condenser, diode, transistor, resistor or the like—are conventionally stored on a tape body which is called generally a carrier tape and packed in a manner of a reel-wrapping.

One example of the carrier tape used for the aforementioned reel-wrapping method has been disclosed in an article (Japanese Patent Application for a Utility Article Laid-Open No. Sho-57-157119) in which, for a case of using a base component made of paper, a plurality of storage holes are provided on the tape-shaped base component having a sprocket hole and electronic components are adhered to the adhesive tape which is pasted onto said base plate. In an alternative method, it is known that a double-side adhesive material with a certain shape and size is pasted at a certain interval on a base component having a similar sprocket as the previous case and electronic components are adhered to the double-side adhesive material. Furthermore, it has been disclosed that, for a case of using the base component made of plastics, a carrier tape is fabricated on which a storage box with a certain size is provided at a certain interval on the tape-shaped base component having a sprocket; said storage box is formed by an embossing technique.

An electronic component 1 having a lead portion 2, as seen in FIG. 7 which is an example of the components to be stored in said carrier tape, is normally subjected to an inspection on the lead portion 2 prior to using the electronic component. Namely, although all lead portions 2 are provided with a constant height and in a regular manner at a constant interval as seen in FIG. 7, if said lead portion is slightly bent or misaligned in height, the electronic components having such an irregularly aligned lead portion cannot be used as a high quality product, so that it is necessary to inspect the presence or absence of a deformation on the lead portion. This type of the product inspection is normally conducted by using an optical equipment.

FIG. 6 shows an example in which the electronic component having a lead portion is under inspection. In this example, a plurality of storage holes 5 are provided on the tape-shaped base component 3 having a sprocket hole 4. The electronic components 1 with a lead portion 2 are adhered to a adhesive tape 6 which is pasted to said base component 3.

Namely, the electronic component 1 with a lead portion is held on an adhesive side of the adhesive tape 6 being pasted to the base component 3, and wrapped on a reel. When the lead portion 2 of the electronic component 1 which is stored in this type of carrier tape is required to be inspected, the electronic component 1 being held by the adhesive tape 6 is photographed with an aid of a photographing device 7 while unwrapping said tape. The photographed image signal is then processed to binary signal through an image processing equipment 8 and a presence/absence of deformation on the lead portion will be determined with judging equipment 9, based on a steady image. The electronic component 1 is irradiated by a light source 10 for the photographing purpose.

Accordingly, in a case when the electronic component on a carrier tape is photographed by using a light source 10 for the photographing, the light irradiated by the light source 10 is reflected, and the steady image might become to be unclear because of said reflected light, causing errors in detecting the deformation on the lead portion. Moreover, since longer time might be needed to achieve the above mentioned detection, the inspection cannot be preformed quickly.

Furthermore, in the conventional way of handling the carrier tapes, the carrier tape is needed to be wrapped around a reel at a certain stage of production. The electronic component is stored while unwrapping the carrier tape being wrapped around the reel, and the electronic component will be again wrapped on another reel and packed. Under such a circumstance, it is inconvenient to control storage holes, double-side adhesive tape, or the number of pieces at the component storage area for the storage box. There are another disadvantages associated to the conventional type of the carrier tape. For instance, when altogether 6,000 pieces are about to be stored at the reel around which a carrier tape is wrapped, there would not be any problems if all of 6,000 pieces are stored at one continuous procedure. On the contrary, for example, after 4,256 component pieces out of 6,000 are stored, the storage operation is interrupted, and when a storage operation will be restarted again for storing remaining component pieces, the number of un-used storage components (that is 1,744 pieces) cannot be detected if the number of used components (that is 4,256 pieces) are not counted every time whenever the storage procedure is interrupted. In order to detect the remaining un-used pieces, the un-used carrier tape is needed to be unwrapped and the number should be counted manually. This is obviously a time-consuming and troublesome process. Moreover, it would require more time to detect and control the number of component storage areas of the carrier tape. It is also not easy to control the stocks of the carrier tape.

OBJECTIVES OF THE INVENTION

All of the foregoing have resulted in a requirement for the material of the present invention in which it is an object to provide a carrier tape which is accompanied with means for preventing the reflection of irradiated light which might cause the detection errors, to conduct the product quality inspection more accurately and quickly, and to count the component storage areas for the storage box, the holes for storage purpose, and to employ double-side adhesive material, or the like, more easily and quickly to inspect the lead portion of the electronic components by aid of optical equipment while said lead portion of the electronic components being stored in the carrier tape are kept at the adhering position thereon.

BRIEF DESCRIPTION OF THE DRAWINGS

The above and many other objectives, features and advantages of this invention will be more fully understood from the ensuing detailed description of the preferred embodiment of the present invention, which description should be read in conjunction with the accompanying drawings wherein:

FIG. 4(b) shows a partially enlarged cross sectional view of 4(a).

SUMMARY OF THE INVENTION

Figure 1A:
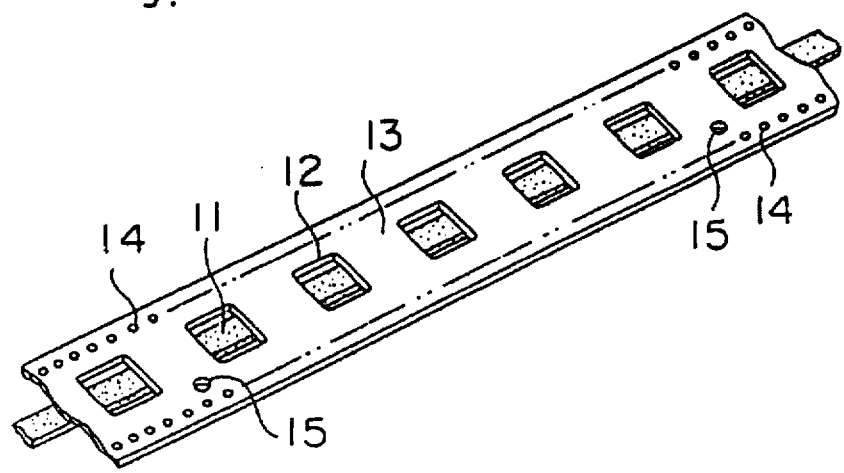
FIGS. 1(a) and 1(b) show an example of the carrier tape according to the present invention, where 1(a) is a perspective view illustrating a portion of the carrier tape which is fabricated by providing a plurality of holes for storage use in a tape-shaped base component having sprocket holes being provided at certain intervals for bonding the electronic components to an adhesive tape being adhered to said base component, and where 1(b) is a partially enlarged vertical cross sectional view of a portion of the carrier tape.
Figure 1B:
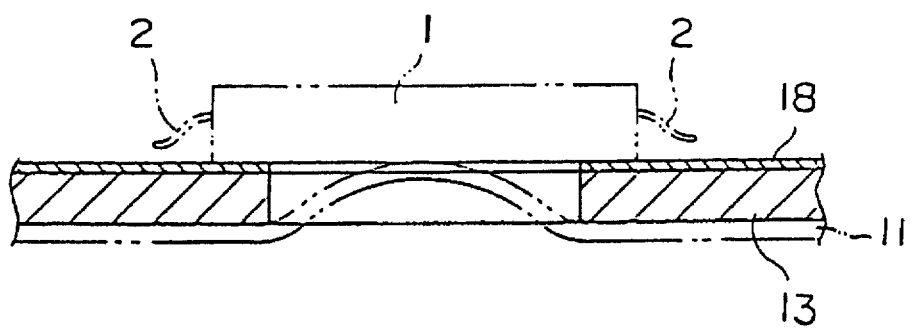

According to the present invention, the product quality inspection can be performed in a more accurate and quick manner because the base component prevents reflected light. Furthermore, the number of pieces of the component storage area by an aid of the optical equipment such as a photoelectric tube or the like can be counted more easily and quickly in a structure in which a hole for counting the component storage areas is provided by the carrier tape per se. The principle structure of the carrier tape of the present invention consists of (1) that a plurality of storage holes are provided in the tape-shaped base component having sprocket holes at certain intervals, and (2) that a carrier tape is adhered in such a manner that the electronic components are adhered to adhesive tape which is pasted to said base component, or a double-side adhesive member with a certain size and shape pasted onto the tape-shaped base component having a sprocket hole. Hence, there could be a type of the carrier tape to adhere the electronic components onto the double-side adhesive tape, or a type of the carrier tape in which a storage box with a certain size and an embossed configuration is formed on the tape-shaped base component having a sprocket hole. There could also be another type of the carrier tape on which a storage box which has an embossed shape with a certain size with holes on the bottom plate located at an upper part of said storage box being formed in the tape-shaped base component having a sprocket hole. Thus the electronic components are pasted to the adhesive tape through said holes at a surface of said base component. The above mentioned base component is a carrier tape for the purpose of storing electronic components and said carrier tape prevents reflected light. Moreover, said base component is characterized by (1) a base component film to prevent light reflection, (2) a base component film to absorb light, or (3) the color black for an adhering side of the base component for adhering the electronic components, the rear side thereof, or the whole structure thereof.

Furthermore, the present invention is characterized by holes for piece counting for storage use, a double-side adhesive member, or storage boxes provided in each tape along its longitudinal direction at certain intervals. The piece counting hole can be circular, rectangular or polygonal shape and the size of the piece-counting hole can be arbitrarily selected to form a carrier tape for storage of electronic components.

As a means for prevention of the light reflection, according to the present invention, a method can be adopted by which a film is formed on the surface of the base component not to absorb nor reflect the light through a certain surface treatment. The film to prevent the light reflection can be formed by means of applying either resin (paints) which do not reflect the light, or ink, or various ions or the like to the surface of the base component, or by immersing the base component into the above mentioned media.

Although it is a common practice to utilize a black base component in order to prevent the light reflection, if the original color of the base component is not black, the surface to which the electronic components are adhered can be painted or immersed with resins (paints) or ink which do not reflect the light.

Since the carrier tape according to the present invention can prevent the light reflection, when the electronic components—which have the lead portion and are adhered on the carrier tape—are photographed by using the light source for the photographing purpose, the electronic components with the lead portion can be clearly photographed and a presence/absence of deformation of the lead portion of the electronic components being adhered to the carrier tape can be accurately determined because the light irradiated from the light source is not reflected and doesn't penetrate into the photographing device.

Moreover, the location for depositing the holes for counting the pieces, according to the present invention, can be normally selected to be close to the sprocket hole at the edge portion in the width direction of the carrier tape, and the interval between each hole can be designed in such a way that, for example, the number of pieces of component storage can be counted by a 5-piece unit or 10-piece unit. Furthermore, the shape of the counting hole is not limited to a certain configuration, but it can be circular or rectangular shape in general. Moreover, the size of said hole can be appropriately chosen according to the width of the carrier tape, but it is preferable to choose the size of a counting hole to be slightly larger than the sprocket hole when the detecting accuracy by the photo-electric tube or the like is taken into consideration. These holes for the piece-counting can be easily provided during the production process by an appropriate means of drilling.

Since the number of pieces of the component storage area can be automatically counted by detecting the numbers of holes for the piece-counting with an aid of photo-electric tube or the like, according to the carrier tape having the piece-counting holes of the present invention, as the electronic components are stored in the reel, the storage pieces can be easily counted. Moreover, if the number of the storage pieces is input to an arithmetic unit in advance, the remaining un-used number of the storage piece in said carrier tape can be easily calculated when the storage procedure of components to said carrier tape is restarted. Furthermore, when the remaining number of un-used pieces in the storage area need be examined, the remaining number can be easily and quickly known since the number can be automatically counted while rewrapping the carrier tape.

DETAILED DESCRIPTION OF PREFERRED EMBODIMENTS

Figure 2:
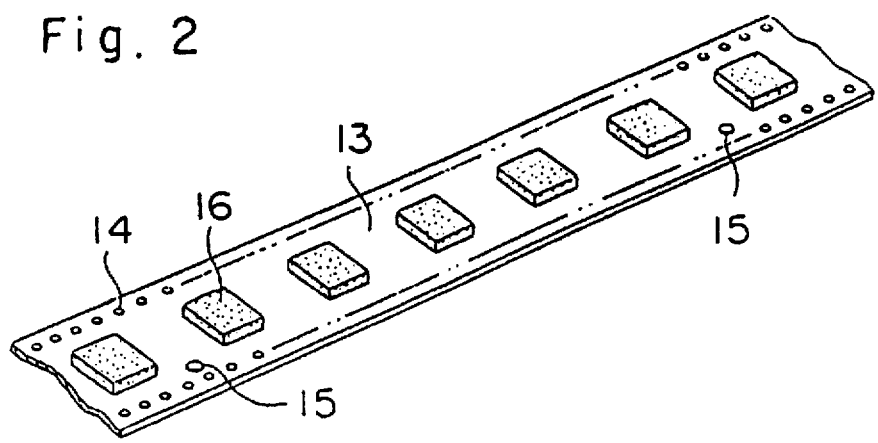
FIG. 2 shows a perspective view of a portion of the carrier tape of the present invention, illustrating that a double-side adhesive with a certain shape and size is pasted onto the tape-shaped base component having similar sprocket holes as that described for FIG. 1 and the electronic components are adhered to said double-side adhesive.
Figure 3:
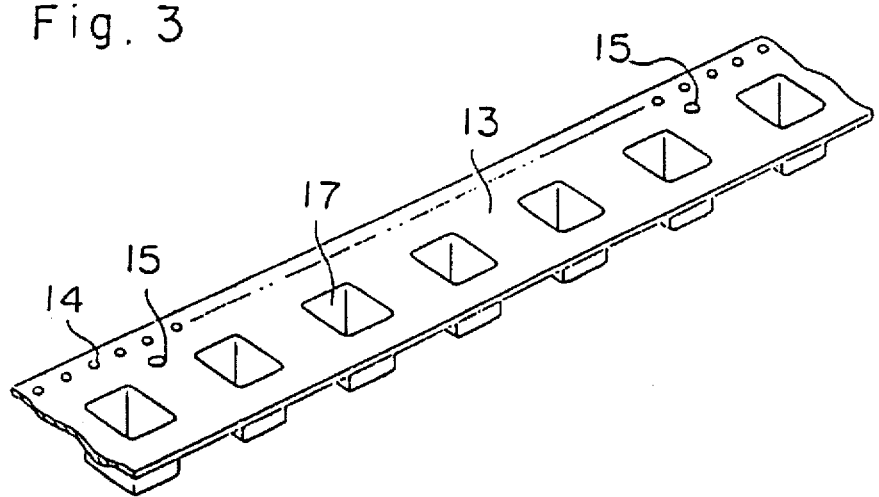
FIG. 3 shows a perspective view of a portion of the carrier tape, on which a storage box with a certain size and an embossed shaped is fabricated on the tape-shaped base component which has similar sprocket holes as previous cases.

FIGS. 1 through 4 show the carrier tape according to the present invention. FIGS. 1(a) and 1(b) show a perspective and partially enlarged views of a portion of the carrier tape, respectively, in which a plurality of holes for storage use are provided on the tape-shaped base component at a certain interval, and the electronic components are adhered to the adhesive tape which is pasted onto the base component. FIG. 2 shows a perspective view of a portion of the carrier tape in which a double-sided adhesive tape is provided at a certain interval on the tape-shaped base component, and the electronic components are adhered to said double-sided adhesive material. FIG. 3 shows a perspective view of a portion of the carrier tape in which an embossment-shaped storage box of a certain size is formed on the tape-shaped base component.

FIGS. 4(a) and (b) show fragmental cross sectional and enlarged views of the carrier tape, respectively, in which a storage box which has an embossed-shape and a certain size hole on the bottom plate at its upper part. The storage boxes are provided at a certain intervals to the tape-shaped base component having a sprocket hole, and the electronic components are adhered to the adhesive tape which is pasted to the lowermost side of said base component for access through the holes. The base component is made of paper or plastic 11, and has a hole for storage purpose 12, an adhesive tape 13, a sprocket hole 14, a hole for piece-counting 15, a double-side adhesive material 16, a storage box 17, a bottom portion of the storage box 17-1, and a hole a-2.

As described before, FIG. 1(b) is a partially enlarged view of a portion of the carrier tape of the present invention, wherein there are a base component 11 and a film to prevent the light reflection 18.

Namely, the carrier tape according to the present invention consists of a film 18 which doesn't reflect the light and is formed on the surface of the base component 13. In order to form such a film for a purpose of prevention of the light reflection, an immersion method of the base component 13 into a liquid media which doesn't reflect the light, or a painting method of the surface of the base component with a material which doesn't reflect the light can be utilized. It is not necessary to limit and control the thickness of the film 18, but it can be appropriately selected according to the thickness of the base component; namely it is normally several micro meter thick.

When the base component is originally black, the surface treatment to form the film is not necessitated since it is a well-known fact that the color black can absorb the light.

Figure 6:
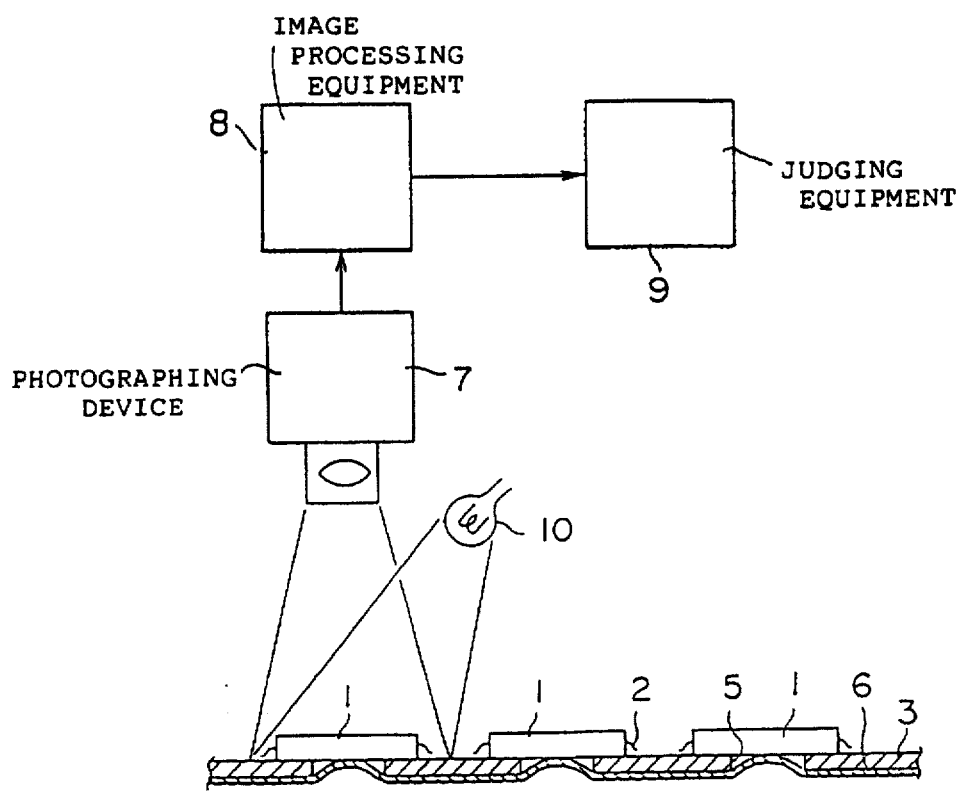
FIG. 6 shows a general view of an example for an inspection of electronic components having lead wires with an aid of optical equipment.
Figure 7:
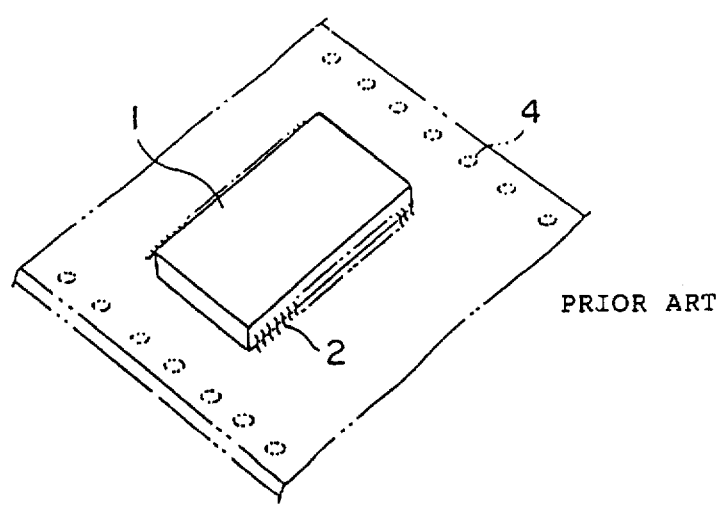
FIG. 7 shows a perspective view of an example of small-scaled electronic component having a lead wire.

While the inspection is carried out on the lead portion of the electronic components being stored to the carrier tape on which the film 18 is formed to prevent the light reflection through a method, as seen in FIG. 6, although the electronic component itself 1 or the its surrounding will be irradiated by the light source 10 for the photographing purpose, a clear image can be still obtained from the electronic component 1 having the lead portion on the photographing device 7, since the light irradiated on the base component 11 is not reflected because of the film 18. As a result, a presence/absence of deformation, namely a presence/absence of bending or unevenness of the lead portion 2 of the electronic components can be determined by the clear and steady image.

Another embodiment will be described by referring to FIGS. 1(a), 2 and 3. The carrier tape seen in FIG. 1(a) is a type of the carrier tape characterized by (1) that a plurality of holes for storage purpose 12 are provided at a certain interval on the tape-shaped base component having the sprocket holes 14, (2) that the electronic components are adhered to the adhesive tape 11 which is pasted to the rear side of the base component in such a manner that the adhering surface is exposed into the storage hole 12, and (3) a hole for the piece-counting 15 is provided, for example, for each 5-piece interval on the edge side of the tape along the width direction.

The carrier tape illustrated in FIG. 2 is a type of the carrier tape which is characterized by (1) that, for example, a rectangular-shaped double-side adhesive material member 16 is pasted on one side of the tape-shaped base component 13 having sprocket holes 14 at a certain interval, (2) that the electronic components are adhered to the double-side adhesive material, and (3) that a hole 15 for the piece-counting is provided at, for example, every 5-piece interval of the storage hole 12 at an edge portion of the tape along its width direction in a similar manner as FIG. 1(a).

Furthermore, the carrier tape shown in FIG. 3 is an another type of the carrier tape which is characterized in that (1) a storage box 17 has an embossed configuration and a certain size is formed on the base component 13 having sprocket holes 14 at a certain interval, (2) the electronic components are stored in the storage box 17, and (3) a hole 15 for the piece-counting is provided at, for example, every 5-piece interval of the storage box 17 at one edge portion of the tape along its width direction.

Figure 4:
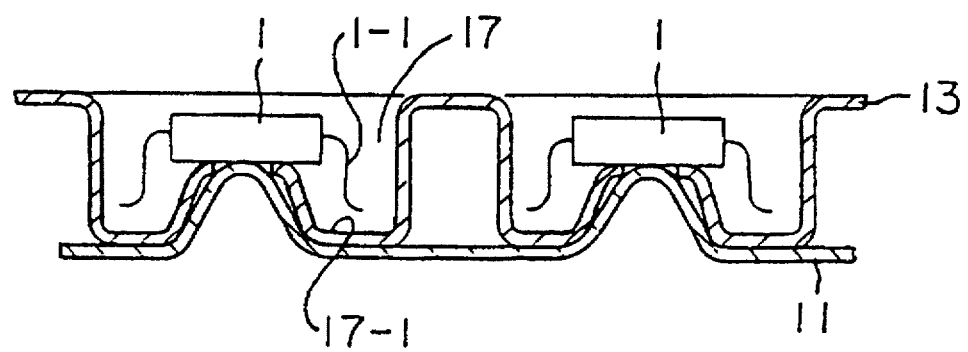
FIGS. 4(a) and 4(b) shows an another embodiment of the present invention, where 4(a) is a longitudinal cross sectional view of the carrier tape, on which a storage box with a certain size of an embossed-shape has a bottom plate on the upper part thereof and holes at said bottom plate, and is provided on the tape-shaped base component with sprockets. The electronic components are adhered to an adhesive tape which is pasted to the lowermost side of said base component through the aforementioned holes being provided on the bottom plate.
Figure 4:
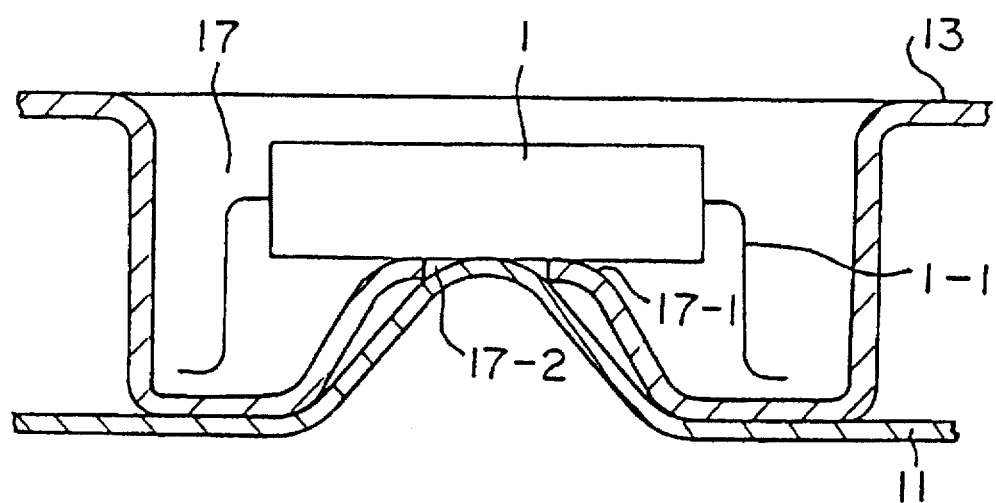

Moreover, the carrier tape illustrated in FIG. 4 has a similar structure as the carrier tape seen in FIG. 3. Namely, the storage box 17 which has an embossed feature and a bottom plate at its uppermost part is provided on the base component 13 having the sprocket holes 14 at a certain interval, and a hole 17-2 is provided at the bottom plate 17-1 of said storage box 17. The adhesive tape 11 is pasted on the lowermost side of the base component 13 and the electronic component 1 having the lead portion 1-1 is adhered to the adhesive tape through the hole 17-2.

Although the carrier tape seen in FIGS. 1(a), 2, 3, and 4 shows the type by which the piece counting hole 15 is provided in order to count every 5 (five) components as a unit, the depositing interval for the piece-counting hole is not limited to be provided at every 5-piece interval, but, for example, it can be provided every 10-piece, 15-piece, or even 20-piece interval. While the hole for the piece-counting 15 is provided during the production process of the carrier tape, it can be provided on the base component in advance.

Figure 5:
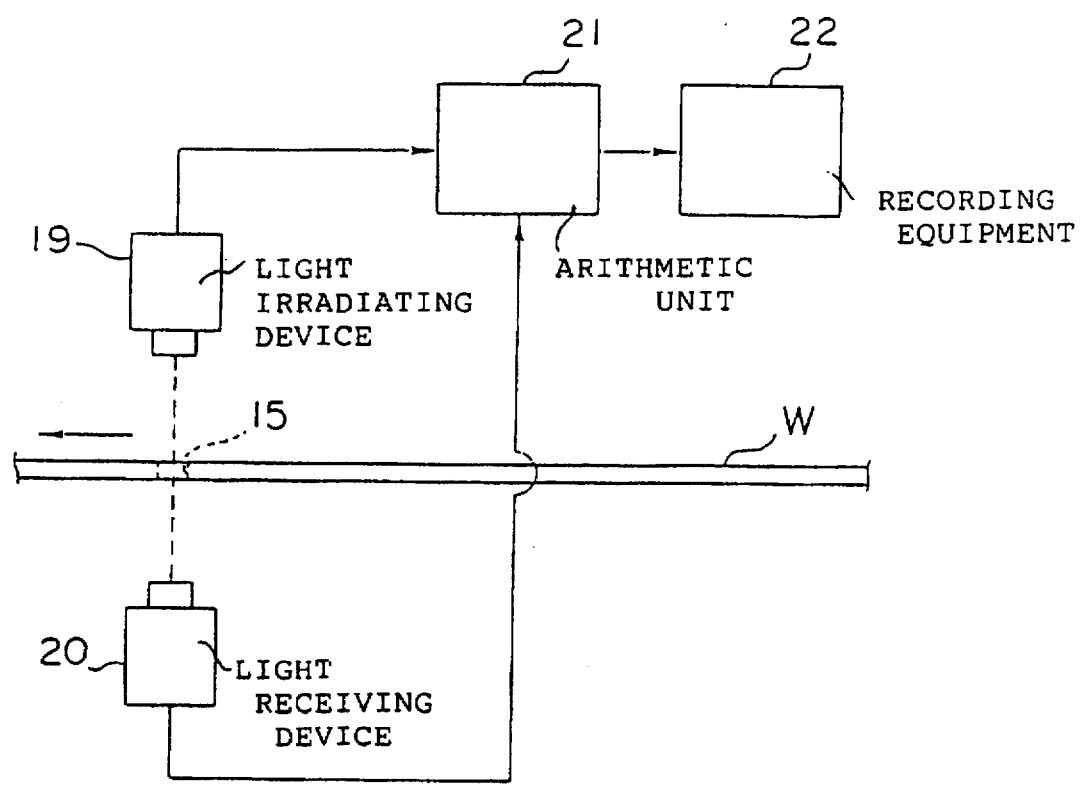
FIG. 5 shows a block diagram which is designed for counting the number of the component storage portions of the carrier tape, according to the present invention.

In the next, FIG. 5 shows a block diagram showing an example of the counting method of component storage area for each carrier tape, wherein there are a carrier tape having holes for the piece-counting W, a light irradiating device 19, a light receiving device 20, an arithmetic unit 21, and recording equipment 22.

Namely, FIG. 5 shows the way how to count the pieces of storage area for every carrier tape with a photo-electric tube. A light irradiating device 19 is provided at the upper surface of the carrier tape W having the piece-counting hole and the light receiving device 20 is provided at the lower surface thereof, respectively, along the vertical central line in order to detect the hole for the piece-counting of the carrier tape W and to output the signal into the arithmetic unit 21. At the arithmetic unit 21, the number of pieces of the component storage area is computed based on said detected signal, and the thus calculated value is output to the recording equipment 22.

According to the aforementioned methods, the hole for the piece-counting 15 can be detected by the light irradiating device 19 and the light receiving device 20 by moving the carrier tape W, and the number of pieces of the storage area can be calculated through the arithmetic unit 21 based on the detected signals. Accordingly, the stored number of components or the remaining number of un-used pieces of the carrier tape can be easily detected by the detected numbers of the holes 15 for the piece-counting. In a case of the shown carrier tape, since the hole 15 for the piece-counting is provided in order to detect every 5 (five) pieces of components at the storage area, if, for example, the hole 15 for the piece-counting detects 100, it means that 495 pieces of the component storage area are counted. However, even if the hole 15 for the piece-counting detects 100 and the actual number of stored electronic components were 497, the counted number can be calibrated by manually moving the arithmetic unit 21. This procedure would be the same when the remaining pieces of the storage area need be detected while unwrapping the carrier tape from the reel.

Once the number of components at the storage area is counted in the aforementioned manner, the counted number is recorded in the recording equipment 22. With this manner, the stock control of the carrier tapes can be easily and accurately performed by recording the number of stored pieces and remaining pieces for every carrier tape.

When the electronic components are stored in the product carrier tape which is wrapped around the reel, the number of pieces of the storage area, according to the present invention, can be detected by installing the counting device on the component storage equipment, or can be detected by using said counting device for an exclusive use for the counting purpose.

As has been described in the above, since the carrier tape of the present invention is provided with a function not to reflect the light on the base component, the light irradiated from the light source for the photographing doesn't irradiate the photographing device, so that a clear image of the electronic component having the lead portion deposited on the carrier tape can be obtained. Accordingly, a presence/absence of the deformation of the lead portion of the electronic components positioned on the carrier tape can be accurately detected. Furthermore, the detecting accuracy on the lead portion of the electronic components having the lead portion can be improved greatly, and the product inspection can speed up.

Moreover, since the carrier tape of the present invention can detect easily and quickly the number of electronic components which are already stored in the component storage area or remaining un-used numbers, the stock control of the carrier tapes can be achieved easily and accurately.

While the invention has been explained with reference to the structure and method disclosed herein, it is not confined to the details as set forth, and this application is intended to cover modifications and changes as may come within the scope of the following claims.

What is claimed is:

1. The improved carrier tape inspection system for increasing speed and accuracy in inspecting a longitudinally disposed carrier tape web carrying and storing a plurality of miniaturized electronic components along its length in spaced stations adapted to inspection of deformations in lead wires extending from the electronic components stored on the carrier tape by an external photoelectric inspection system photographically viewing the electric components on the carrier tape in response to illumination of the tape by an external light source which reflects light off the tape web in the vicinity of the lead wires, comprising in combination:

a plurality of said electric components having said lead wires extending therefrom located at said spaced stations, said carrier tape comprising a longitudinal web of flexible material, said electronic components being affixed in place at said stations for inspection of said lead wires, means providing a photographic inspection directed normally toward one surface of the carrier tape at said spaced stations along the carrier tape for inspection of deformations of said lead wires on said electronic components by said photoelectric system, and light reflection reducing means disposed on said inspection side surface of the carrier tape web material to significantly reduce light reflection from the tape surface photographically interfering with images of the lead wires, whereby the inspection system more accurately and more quickly inspects the electronic components carried by the carrier tape with reduced interference from light reflected from the inspection side surface of the carrier tape.

2. The system of claim 1 wherein said component carrying stations further comprise:

holes through said carrier tape, and an adhesive tape accessible at said holes for adhesively securing the electronic components to the carrier tape at said stations.

3. The system of claim 1 wherein said component carrying stations further comprise:

a double sided adhesive member adhered to the carrier tape.

4. The system of claim 1 wherein said component carrying stations further comprise:

a storage box formed into said carrier tape in an embossed shape having a hole through the bottom of the storage box.

5. The system of claim 4 further comprising an adhesive tape pasted to a surface of the carrier tape opposite to said inspection side surface to appear at said hole through the bottom of the storage box for adhering the electronic components to the adhesive tape within said box.

6. The system of claim 1 further comprising, a series of sprocket holes along the tape and an additional series of counting holes for inspection by a photoelectric instrument for counting electronic components, said holes being spaced along the tape at intervals indicating the spacing for an integral number of electronic components between successive counting holes.

7. The system of claim 1 wherein said one surface of the tape web is black.

8. The system of claim 1 further comprising piece-counting holes spaced along the length of the tape to signify a predetermined number of said component stations.

* * * * *